(12) United States Patent
Ko

(10) Patent No.: US 6,824,969 B1
(45) Date of Patent: Nov. 30, 2004

(54) LOW PROFILE ELECTRICAL ASSEMBLY

(75) Inventor: David (Tso-Chin) Ko, Fullerton, CA (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 10/796,935

(22) Filed: Mar. 9, 2004

(51) Int. Cl.$^7$ ............................................. H01R 13/64
(52) U.S. Cl. ....................... 430/680; 439/633; 439/76.1
(58) Field of Search ................. 439/76.1, 633, 439/680, 607, 609, 946; 361/737

(56) References Cited

U.S. PATENT DOCUMENTS

| | | | |
|---|---|---|---|
| 5,330,363 A | | 7/1994 | Gardner et al. |
| 5,456,610 A | | 10/1995 | Banakis et al. |
| 5,478,260 A | * | 12/1995 | Kaufman et al. ............ 439/609 |
| 5,586,893 A | * | 12/1996 | Mosquera .................... 439/108 |
| 5,833,473 A | * | 11/1998 | Betker et al. ............... 439/76.1 |
| 6,004,144 A | * | 12/1999 | Yeh et al. ................... 439/76.1 |
| 6,010,359 A | | 1/2000 | Etters et al. |
| 6,273,753 B1 | | 8/2001 | Ko |
| 6,305,978 B1 | | 10/2001 | Ko et al. |
| 6,338,652 B1 | | 1/2002 | Ko |
| 6,474,998 B1 | * | 11/2002 | Takeuchi .................... 439/76.1 |
| 6,619,985 B1 | | 9/2003 | Ko |
| 6,641,409 B1 | * | 11/2003 | Gu ............................. 439/76.1 |

* cited by examiner

Primary Examiner—Tho D. Ta
Assistant Examiner—Briggitte R. Hammond
(74) Attorney, Agent, or Firm—Wei Te Chung

(57) ABSTRACT

An electrical assembly comprises a guiding frame, an electrical connector and a module. The guiding frame comprises a pair of guiding beams and a pair of transverse plates interconnecting the guiding beams to define a mating port thereamong. The electrical connector comprises an insulative mating tongue having a mating face and a plurality of passageways defined in the mating face, and a plurality of contacts each comprising a resilient arm received in corresponding passageway and having a contact portion extending beyond the mating face of the mating tongue. The module comprises a daughter card having a mating edge with a plurality of conductive pads on one side thereof. The daughter card and the electrical connector are inserted into the guiding frame with the mating tongue and the mating edge stackedly received in the mating port. The contact portions of the contacts electrically abut against corresponding conductive pads of the daughter card.

9 Claims, 7 Drawing Sheets

LOW PROFILE ELECTRICAL ASSEMBLY

CROSS-REFERENCE TO RELATED APPLICATION

Relevant subject matter is disclosed in pending U.S. patent application Ser. No. 10/774,179, filed on Feb. 6, 2004 and entitled "LOW PROFILE ELECTRICAL CONNECTOR ASSEMBLY", which is invented by the same inventor as this patent application and assigned to the same assignee with this application.

BACKGROUND OF THE INVENTION

1. Field of the Invention

The present invention relates to an electrical assembly, and particularly to an electrical assembly having a low profile.

2. Description of Related Art

Most notebook computers come with slots for PC cards, and the consumers are quite familiar with them. While PC central processing unit (CPU) clock frequencies are rising along with the speeds of peripheral technologies like PCI Express and Gigabit Ethernet, the PC Card standard would not be able to handle developing applications smoothly. A new specification named NEWCARD will take the next generation in PC Card evolution. In addition to the successful characteristics of the PC Card: reliability, ease of use and wide industry support while delivering external expansion with reduced size, higher speed, lower costs and support of advanced serial I/O technologies, USB 2.0 and PCI Express, the new specification offers key advantages in terms of faster speed and smaller size. So, devices which connect the NEWCARDs and the PCI Express interfaces in the notebooks must be low profile interconnection and also meet the signal integrity requirement of PCI Express in the notebook application.

SUMMARY OF THE INVENTION

An object of the present invention is to provide an electrical assembly having a low profile.

Another object of the present invention is to provide an electrical assembly having a guiding rail to achieve a reliable engagement between a cable connector and a module thereof.

To achieve the above object, an electrical assembly comprises a guiding frame, an electrical connector and a module. The guiding frame comprises a pair of guiding beams and a pair of transverse plates interconnecting the guiding beams to define a mating port thereamong. The electrical connector comprises an insulative housing comprising a mating tongue having a mating face and a plurality of passageways defined in the mating face, and a plurality of contacts retaining in the insulative housing. Each contact comprises a resilient arm received in corresponding passageway having a contact portion extending beyond the mating face of the mating tongue. The module comprises a daughter card having a mating edge with a plurality of conductive pads on one side thereof. The daughter card and the electrical connector are inserted into the guiding frame with the mating edge and the mating tongue stackedly received in the mating port. The contact portions of the contacts resiliently and electrically abut against corresponding conductive pads of the daughter card. The transverse plates tightly hold the mating edge and the mating tongue in the mating port to ensure proper normal force between the contact and the conductive pad.

Other objects, advantages and novel features of the invention will more apparent from the following detailed description when taken in conjunction with the accompanying drawings.

DETAILED DESCRIPTION OF THE INVENTION

Figure 1:
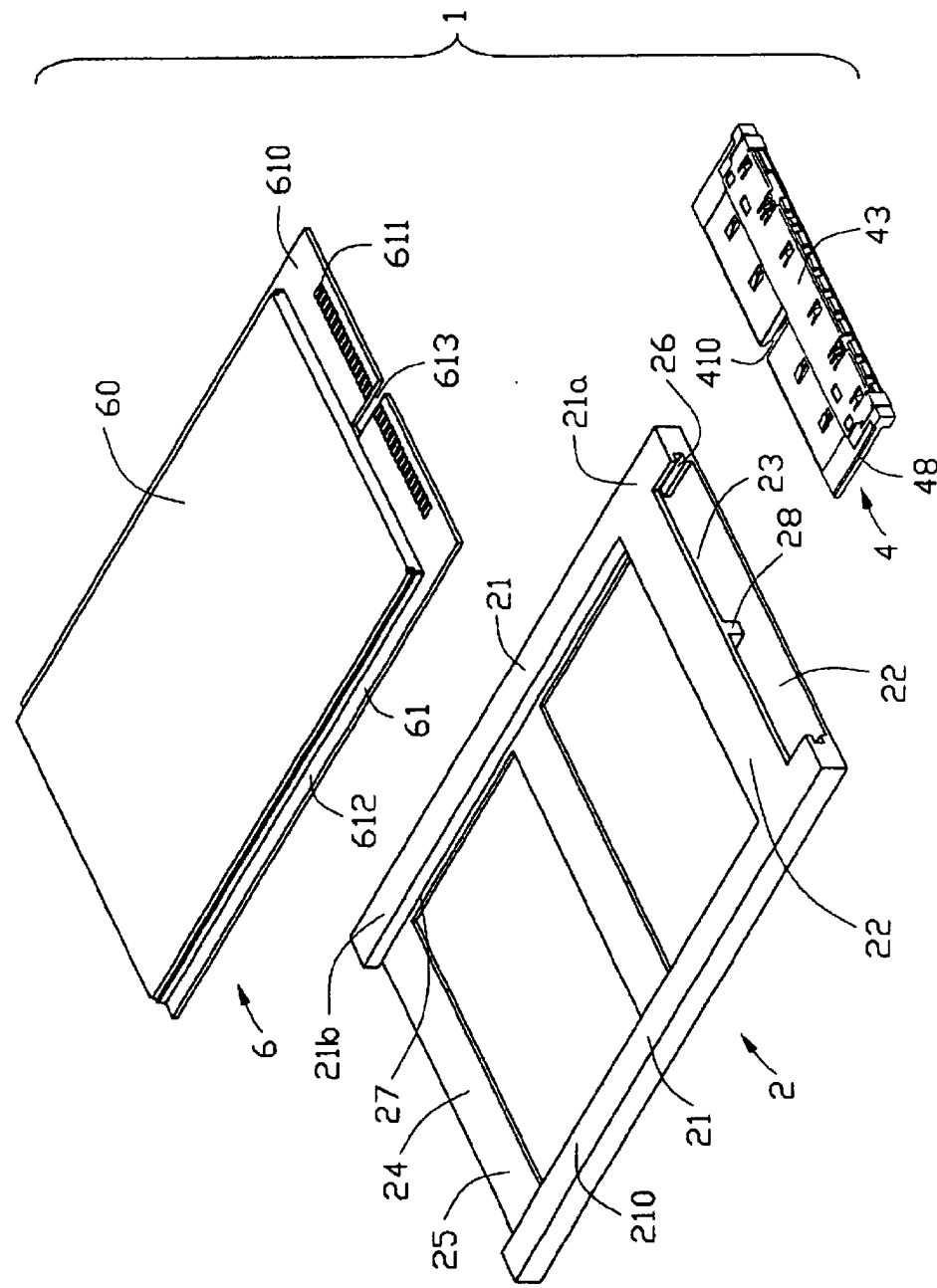
FIG. 1 is an exploded perspective view of an electrical assembly in accordance with the present invention.
Figure 2:
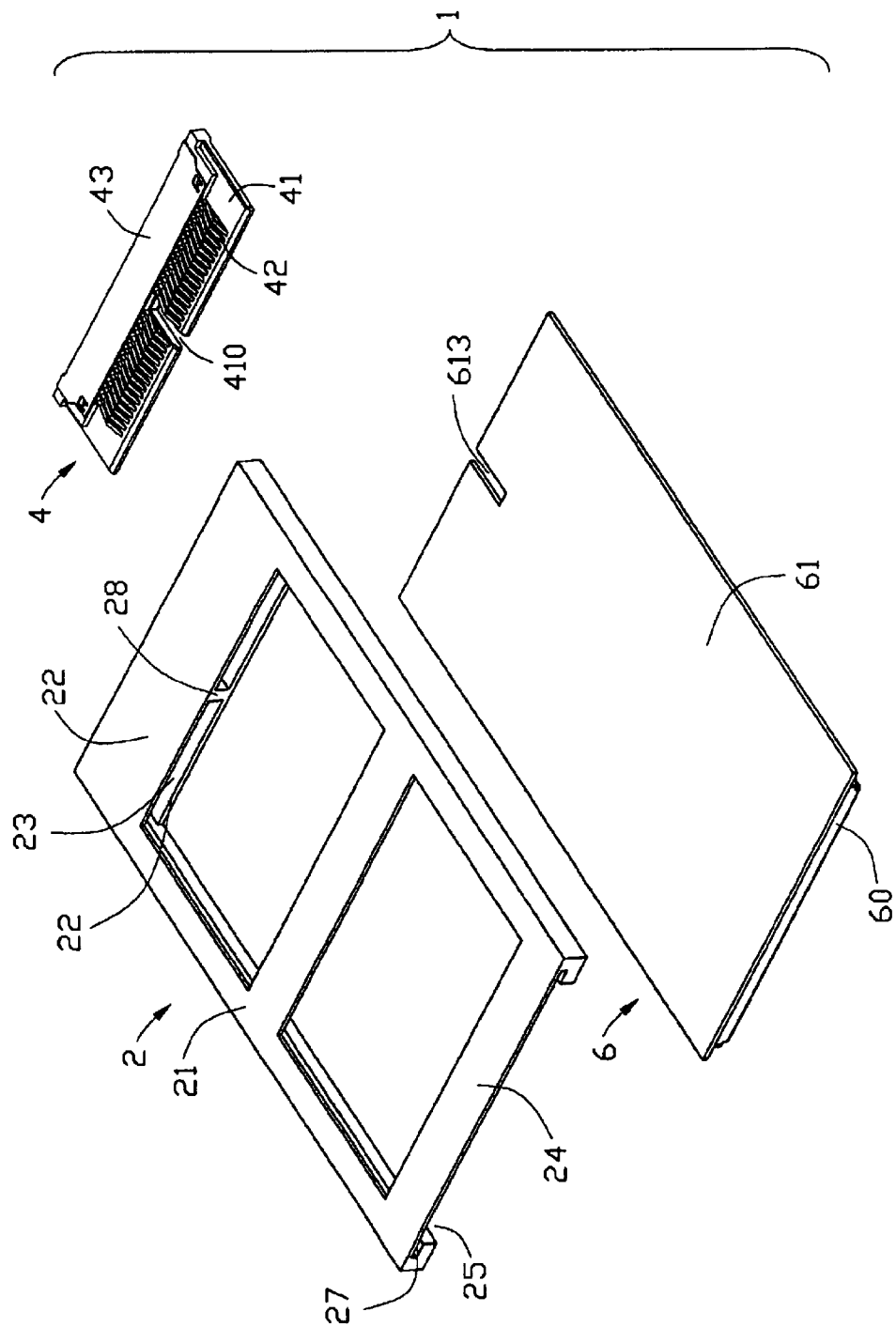
FIG. 2 is an exploded perspective view of the electrical assembly taken from another aspect.

Referring to FIGS. 1 and 2, an electrical assembly 1 in accordance with the present invention comprises a guiding frame 2 adapted to be attached and bonded to a back cover of a Liquid Crystal Display (LCD) (not shown), an electrical connector 4 and a module 6 both inserted into the guiding frame 2 to establish an electrical connection therebetween for signal transmission.

Referring to FIGS. 1 and 2, the guiding frame 2 comprises a pair of parallel elongated guiding beams 21 spaced from each other along a transverse direction thereof. Each guiding beam 21 has a first section 21a where the electrical connector 4 inserts into the guiding frame 2 and a second section 21b where the module 6 inserts into the guiding frame 2. The guiding frame 2 comprises a pair of opposite transverse plates 22 spaced from each other along a vertical direction perpendicular to the transverse direction and interconnecting the first sections 21a of the guiding beams 21 to define a mating port 23 therebetween. A pair of transverse pieces 24 is formed to interconnect edges of the second ends 21b of the guiding beams 21 to strengthen the guiding frame 2. The transverse pieces 24 are coplanar with and spaced from one transverse plate 22. The transverse pieces 24 and the second sections 21b of the guiding beams 21 together define a chamber 25 therebetween which communicates and is aligned with the mating port 23. A rib 28 interconnects middle portions of the transverse plates 22 and is substantially parallel to the guiding beams 21 to divide the mating port 23 into two parts.

Figure 5:
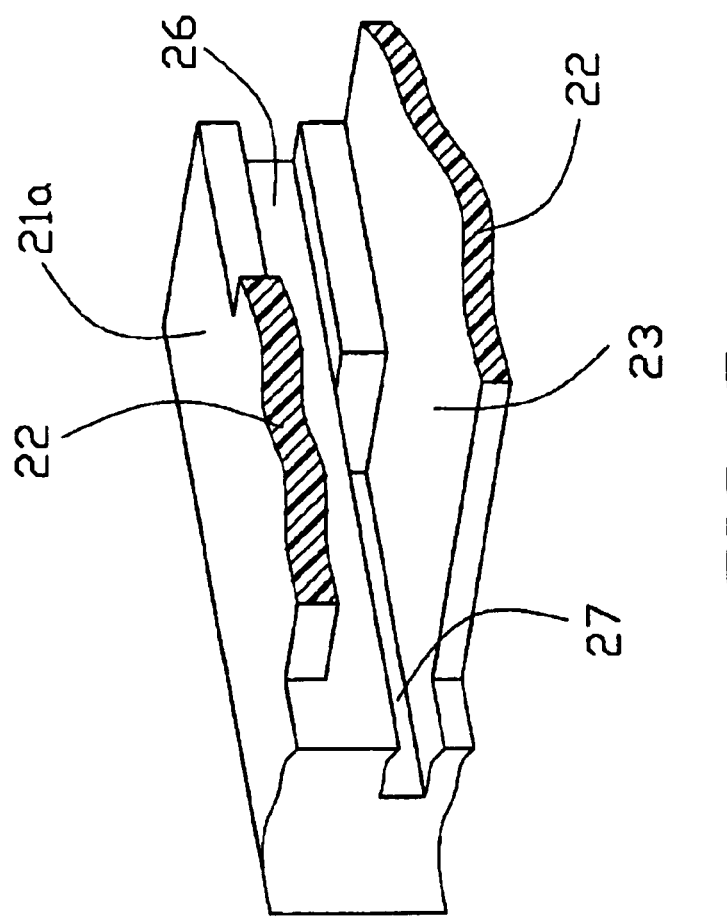
FIG. 5 is a partially fragmentary view of a guiding frame of the electrical assembly shown in FIG. 1.

Referring to FIGS. 1 and 2 in conjunction with FIG. 5, each guiding beam 21 defines a first guiding slot 26 in an inner face of the first end 21a thereof and communicating with the mating port 23, and a second guiding slot 27 in an inner face of the second end 21b thereof and communicating with the cavity 25. The first guiding slot 26 is located above the second guiding slot 27.

Figure 3:
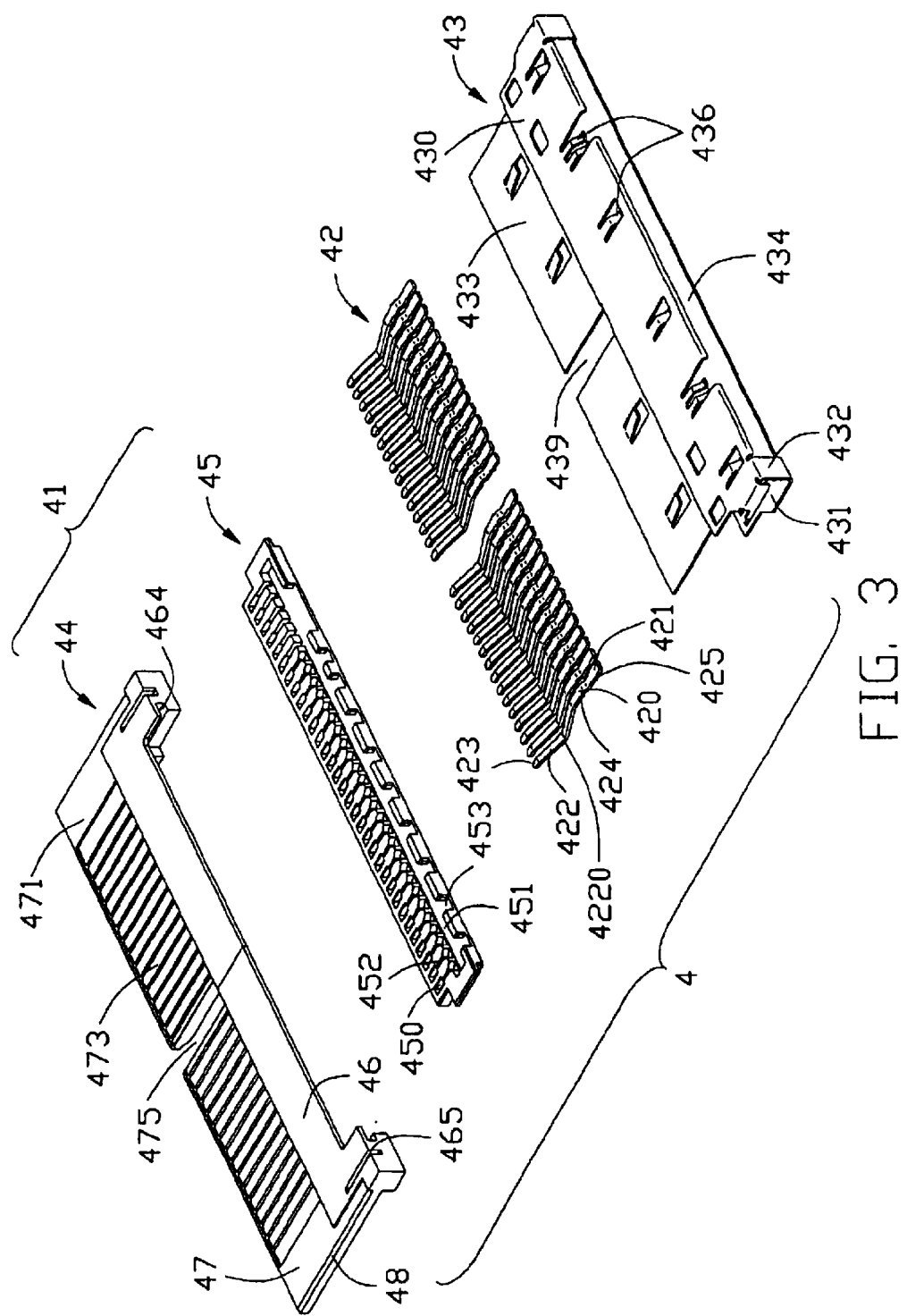
FIG. 3 is an exploded perspective view of an electrical connector of the electrical assembly shown in FIG. 1.
Figure 4:
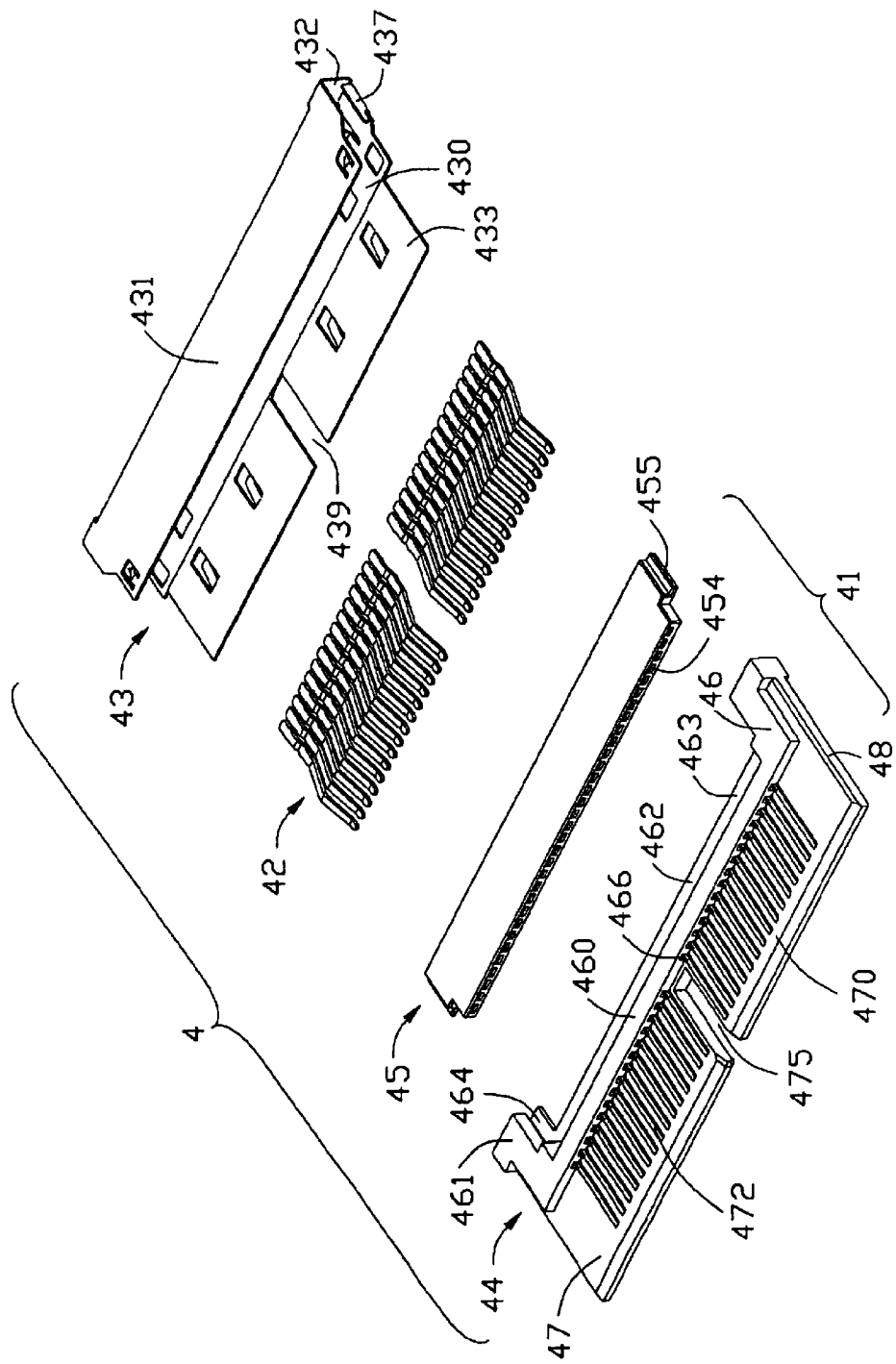
FIG. 4 is an exploded perspective view of the electrical connector of the electrical assembly taken from another aspect.

Referring to FIGS. 3-4, the electrical connector 4 comprises an insulative housing 41 received in the mating port 23 of the guiding frame 2, a plurality of contacts 42 retained in the insulative housing 41 and a shield member 43 enclosing the insulative housing 41. The insulative housing 41 comprises a first housing 44 and a second housing 45 engaging with the first housing 44.

Figure 7:
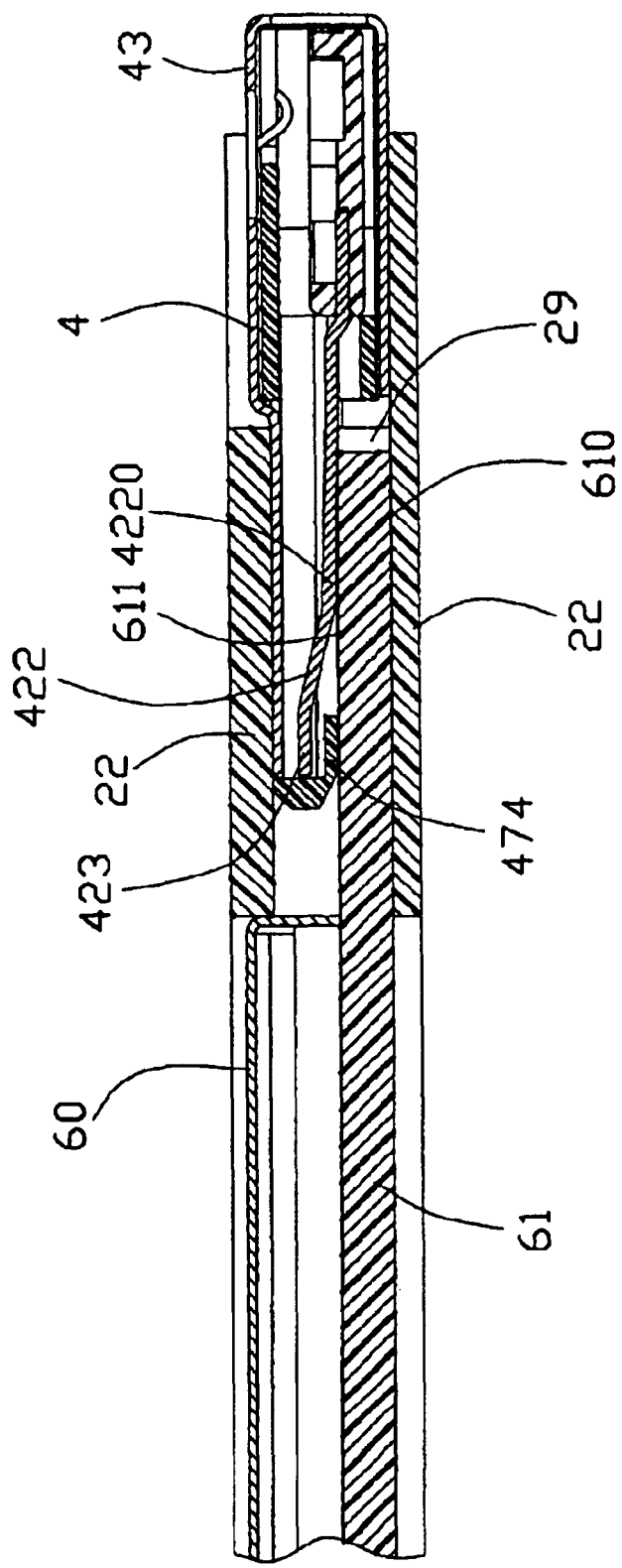
FIG. 7 is a partially cross-sectional view of the electrical assembly taken along line 7—7 of FIG. 6.

The first housing 44 comprises an elongated base 46 and a mating tongue 47 extending forwardly from the elongated base 46. A pair of first guiding flanges 48 is formed at opposite ends of the first housing 44. The base 46 comprises a front wall 460, a pair of side walls 461 extending rearwardly from opposite ends of the front wall 460, and an upper wall 462 extending rearwardly from an upper end of the front wall 460. The front wall 460, the side walls 461 and the upper wall 462 together define a receiving space 463 thereamong. The side walls 461 define a pair of channels 464 in inner sides thereof to communicate with the cavity 463, and a pair of slits 465 on upper sides thereof. The front wall 460 defines a plurality of first retention holes 466 extending therethrough and in communication with the cavity 463. The mating tongue 47 has a mating face 470 and an upper face 471 opposite to the mating face 470. The mating tongue 47 defines a plurality of passageways 472 in the mating face communicating and aligned with the first retention holes 466 of the base 46, and a groove 473 in the top face 471. A stopper 474 is formed at a free end of each passageway 472 as shown in FIG. 7. The mating tongue 47 defines a gap 475 preferably at middle portion thereof corresponding to the rib 28 of the guiding frame 2.

The second housing 45 defines a plurality of apertures 450 in an upper face adjacent a front end thereof, a recess 451 in the upper face adjacent to a rear end thereof, and a plurality of slits 452 each communicating with a corresponding aperture 450 and the recess 451. The second housing 45 further defines a plurality of cutouts 453 at a rear side of the recess 451 and a plurality of second retention holes 454 extending rearwardly from a front face thereof and communicating with corresponding apertures 450. A pair of second guiding flanges 455 is formed at opposite ends of the second housing 45.

Each contact 42 comprises a tail portion 421, a body portion 420 upwardly bending and extending forwardly from the tail portion 421, a resilient arm 422 curvedly and forwardly extending from the body portion 420 and having a contact portion 4220, and a distal 423 formed at a free end of the resilient arm 422. The tail portion 421 and the body portion 420 are respectively formed with a pair of barbs 425, 424 on opposite sides thereof.

Referring to FIGS. 1-4, in assembly of the electrical connector 4, the tail portions 421 of the contacts 42 are inserted into the second retention holes 454 of the second housing 45 and exposed into the apertures 450 for soldering to conductors of a plurality of cables (not shown) which are electrically connected with an electrical equipment, such as a mother board of a notebook. The barbs 425 of the tail portions 421 engage with inner sides of the second retention holes 454. The second housing 45 is then received in the cavity 463 of the first housing 44 with a bottom face thereof acting as a bottom face of the base 46 of the first housing 44, thereby reducing a height of the electrical connector 4. Simultaneously, the second guiding flanges 455 of the second housing 45 are received in the channels 464 of the first housing 44 with the first retention holes 466 of the first housing 44 aligned with the second retention holes 454 of the second housing 45. The body portions 420 of the contacts 42 are received in the first retention holes 466 of the first housing 44 with the barbs 424 engaging with inner sides of the first retention holes 466. The resilient arms 422 of the contacts 42 are received in the passageways 472 with the contact portions 4220 extending beyond the mating face 470 of the mating tongue 47. The distal 423 of the contacts 42 slightly and resiliently abut against the stopper 474 of the mating tongue 47 for pre-pressing the contacts 42. The first housing 44 and the second housing 45 together form the insulative housing 41.

The shield member 43 is stamped and formed from a metal sheet and comprises an upper plate 430, a lower plate 431 opposite to the upper plate 430, a pair of connect plates 432 connecting with rear edges of the upper and the lower plates 430, 431 at opposite ends thereof, and a projecting plate 433 extending forwardly from a front edge of the upper plate 430. A shield space 434 is defined by the upper and lower plates 130, 131 and the connect plates 432. The upper plate 430 has a plurality of resilient fingers 436 extending into the shield space 134 adjacent a rear end thereof, and a pair of side flaps 437 extending downwardly from opposite edges of the upper plate 430. The projecting plate 433 defines a gap 439 corresponding to the gap 475 of the mating tongue 47 at a middle portion thereof.

Referring to FIGS. 1 and 2, the shield member 43 is assembled to the insulative housing 41. The upper plate 430 of the shield member 43 is attached to the upper face of the base 46 of the first housing 44 with the side flaps 437 retained in the slits 465 of the first housing 44. The resilient fingers 436 extend into the recess 451 of the second housing 45 for electrically connecting to a grounding bus (not shown) received in the recess 451. The lower plate 431 of the shield member 43 covers the bottom face of the base 46 of the first housing 44, whereby the base 46 of the first housing and the second housing 45 are together received in the shield space 434. The projecting plate 433 of the shield member 43 is received in the groove 473 of the first housing 44 with the gap 475 of the mating tongue 47 aligned with the gap 439 of the projecting plate 433 to form a keyway 410.

Referring back to FIGS. 1 and 2, the module 6 comprises a daughter card 61 and a shell 60 attached to one side of the daughter card 61. The daughter card 61 has a mating edge 610 with a plurality of conductive pads 611 evenly arranged on one side of the mating edge 610. The mating edge 610 defines a gap 613 corresponding to the rib 28 of the guiding frame 2 at a middle portion thereof. A pair of guiding edges 612 is formed at opposite sides of the daughter card 61.

Figure 6:
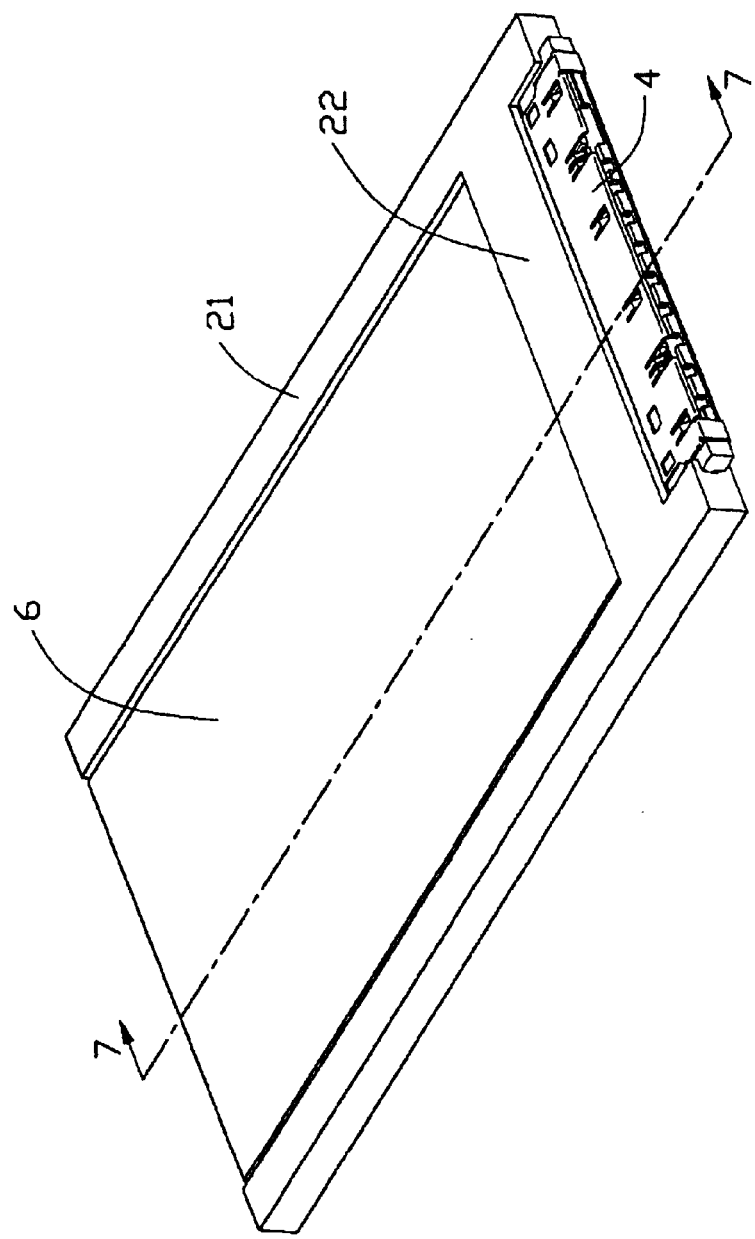
FIG. 6 is an assembled perspective view of the electrical assembly shown in FIG. 1.

Referring to FIGS. 1, 6 and 7, the electrical connector 4 is inserted into the guiding frame 2 with the first guiding flanges 48 thereof sliding along the first guiding slot 26. The mating tongue 47 is received in the mating port 23 with the top face 471 thereof abutting against an inner face of one of the transverse plates 22 and with the keyway 410 of the electrical connector 4 fittingly receiving the rib 28 of the guiding frame 2. A temporary space 29 is defined between the mating face 470 of the mating tongue 47 and an inner face of another transverse plate 22. Subsequently, the module 6 is inserted into the guiding frame 2 with the guiding edge 612 of the daughter card 61 sliding along the second guiding slot 27. The shell 60 is received in the chamber 25 of the guiding frame 2. The mating edge 610 is received in the temporary space 29 of the guiding frame 2 with the gap 613 of the daughter card 61 fittingly receiving the rib 28 of the guiding frame 2. The contact portions 4220 of the contacts 42 are resiliently deflected due to pressing of the mating edge 610 and electrically abut against the corresponding conductive pads 611 of the daughter card 61. In order to provide enough normal force between the contact 42 and the conductive pad 611, the transverse plates 22 are provided on the guiding frame 2 to hold the mating tongue 47 and the mating edge 610 in the mating port 23. The electrical assembly 1 is generally equipped on a notebook (not shown) and configured to be approximately 2.5 mm high for low profile requirement. Accordingly, the guiding frame 2 is configured to be approximately 2.5 mm high. Thus, thin transverse plates 22 are apt to warpage when the electrical connector 4 and the module 6 are inserted into the mating port 23 of the guiding frame 2. The rib 28 interconnecting the transverse plates 22 is provided to strengthen the guiding frame 2 for solving the problem mentioned above. It is should be noted that other means might be provided on the guiding frame 2 to strengthen the transverse plates 22 instead of the rib 28. For example, a strengthened metallic sheet is configured on the guiding frame 2 to enclose the transverse plates 22.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical assembly, comprising:
   a guiding frame comprising a pair of spaced guiding beams and a pair of vertically spaced transverse plates interconnecting the guiding beams to define a mating port therebetween;
   an electrical connector comprising:
      an insulative housing comprising a mating tongue having a mating face and a plurality of passageways defined in the mating face;
      a plurality of contacts retained in the insulative housing, each contact comprising a resilient arm received in a corresponding passageway, the resilient arm having a contact portion extending beyond the mating face of the mating tongue; and
      a shield member surrounding the insulative housing; and
   a module comprising a daughter card having a mating edge and a plurality of conductive pads arranged on one side of the mating edge, the daughter card and the electrical connector being inserted into the guiding frame and the mating edge and the mating tongue stackedly received in the mating port, the contact portions of the contacts resiliently abutting against corresponding conductive pads of the daughter card, the transverse plates tightly holding the mating edge and the mating tongue in the mating port to ensure a proper normal force between the contact and the conductive pad, wherein the guiding frame is formed with a strengthening rib interconnecting the transverse plates, and the mating tongue of the electrical connector and the mating edge of the daughter card respectively define a keyway and a gap for receiving the strengthening rib.

2. The electrical assembly as claimed in claim 1, wherein the mating tongue is formed with a stopper at a distal end of each passageway, and wherein each contact comprises a distal end abutting against the stopper for pre-pressing the contact.

3. The electrical assembly as claimed in claim 1, wherein the guiding frame is formed with a transverse piece interconnecting the guiding beams and spaced from the transverse plates in a horizontal direction.

4. The electrical assembly as claimed in claim 1, wherein the module further comprises a shell attached to one side of the daughter card.

5. The electrical assembly as claimed in claim 1, wherein each guiding beam defines a first guiding slot and a second guiding slot in an inner face thereof, and wherein the electrical connector and the module are both formed with a pair of guiding flanges respectively received in the first and second guiding slots.

6. The electrical assembly as claimed in claim 5, wherein the first guiding slot is located above the second guiding slot.

7. The electrical assembly as claimed in claim 1, wherein the insulative housing comprises a first housing defining a cavity, and a second housing received in the cavity of the first housing.

8. The electrical assembly as claimed in claim 7, wherein the first housing defines a plurality of retention holes respectively communicating with the cavity and corresponding passageways, and wherein each of the contacts comprises a tail portion retained in the second housing and a body portion engagably received in the retention hole of the first housing.

9. An electrical assembly comprising:
   a card shaped structure defining a mating port in a front portion;
   a rib formed in said mating port and extending along a front-to-back direction;
   a horizontal printed circuit board defining conductive pads and a first notch on a front edge section thereof in compliance with said rib;
   an electrical connector defining a mating portion in compliance with said mating port and a second notch in compliance with said rib; and
   a plurality of contacts disposed in the connector; wherein
   the printed circuit board is forwardly assembled to the structure under a condition that the front edge section is located in the mating port and the first notch receives said rib at one level, and the connector is rearwardly assembled to the structure under a condition that the mating portion is received in the mating port and the second notch receives said rib at another level, wherein the contacts are mechanically and electrically engaged with the corresponding pads, respectively.

* * * * *